United States Patent
Liang et al.

(10) Patent No.: US 10,342,153 B2
(45) Date of Patent: Jul. 2, 2019

(54) STACK STRUCTURE AND THE MANUFACTURING METHOD OF THE SAME

(71) Applicant: DELTA ELECTRONICS, INC., Taoyuan (CN)

(72) Inventors: Le Liang, Taoyuan (CN); Zhenqing Zhao, Taoyuan (CN)

(73) Assignee: Delta Electronics, Inc., Taoyuan, Taiwan (CN)

( * ) Notice: Subject to any disclaimer, the term of this patent is extended or adjusted under 35 U.S.C. 154(b) by 0 days.

(21) Appl. No.: 15/291,155

(22) Filed: Oct. 12, 2016

(65) Prior Publication Data

US 2017/0112001 A1  Apr. 20, 2017

(30) Foreign Application Priority Data

Oct. 16, 2015 (CN) .......................... 2015 1 0673944

(51) Int. Cl.
  *H05K 7/00* (2006.01)
  *H05K 7/14* (2006.01)
  *H01L 25/07* (2006.01)

(52) U.S. Cl.
  CPC ........... *H05K 7/1432* (2013.01); *H01L 25/07* (2013.01); *H01L 2224/48247* (2013.01)

(58) Field of Classification Search
  CPC ................. H05K 7/1432; H01L 25/07; H01L 2224/48247
  USPC ....................................................... 361/735
  See application file for complete search history.

(56) References Cited

U.S. PATENT DOCUMENTS

| 4,696,525 A | * | 9/1987 | Coller | ................. H05K 7/1046 439/69 |
| 5,498,902 A | * | 3/1996 | Hara | ..................... H01L 21/565 257/666 |
| 6,144,571 A | * | 11/2000 | Sasaki | .................. H01L 25/162 257/687 |
| 6,572,387 B2 | * | 6/2003 | Burns | ............... H01L 23/49537 257/686 |
| 6,590,282 B1 | * | 7/2003 | Wang | .................. H01L 25/0657 257/685 |
| 6,603,197 B1 | * | 8/2003 | Yoshida | ............ H01L 23/49537 257/666 |

(Continued)

FOREIGN PATENT DOCUMENTS

| CN | 101996982 A | 3/2011 |
| CN | 102867815 A | 1/2013 |

OTHER PUBLICATIONS

The Chinese 1OA issued by SIPO dated Jul. 4, 2018.
The CN2OA issued Feb. 3, 2019 by the CNIPA.

Primary Examiner — Hung S. Bui
(74) Attorney, Agent, or Firm — Yunling Ren

(57) ABSTRACT

Disclosed is a stack structure and its manufacturing method. The stack structure includes at least two stacked modules, wherein at least one of the modules is a power module; at least one metal connection component which is in integrated structure and comprises a first end, a second end and a connection portion with the first end being electrically connected to one of the modules and the second end being electrically connected to the other module; at least one molding compound packaging the at least one module and the end of the metal connection component which is electrically connected to the module, respectively.

10 Claims, 22 Drawing Sheets

(56) References Cited

U.S. PATENT DOCUMENTS

| | | | | |
|---|---|---|---|---|
| 6,773,959 B2* | 8/2004 | Yau | ............... | H01L 25/105 |
| | | | | 257/686 |
| 6,972,479 B2* | 12/2005 | Chen | ............... | H01L 23/49861 |
| | | | | 257/666 |
| 7,622,800 B2* | 11/2009 | Ramakrishna | ........ | H01L 25/105 |
| | | | | 257/686 |
| 7,714,416 B2* | 5/2010 | Bauer | ............... | H01L 23/49551 |
| | | | | 257/666 |
| 7,851,829 B2* | 12/2010 | Theuss | ............... | G01P 1/023 |
| | | | | 257/254 |
| 8,664,755 B2* | 3/2014 | Lim | ............... | H01L 25/50 |
| | | | | 257/676 |
| 9,475,694 B2* | 10/2016 | Martizon, Jr. | ............... | B81C 3/008 |
| 2004/0238931 A1* | 12/2004 | Haba | ............... | H01L 23/5387 |
| | | | | 257/686 |
| 2005/0205970 A1 | 9/2005 | Chen | | |
| 2009/0004783 A1* | 1/2009 | Lee | ............... | H01L 23/49555 |
| | | | | 438/124 |
| 2014/0196540 A1 | 7/2014 | Martizon, Jr. et al. | | |

* cited by examiner

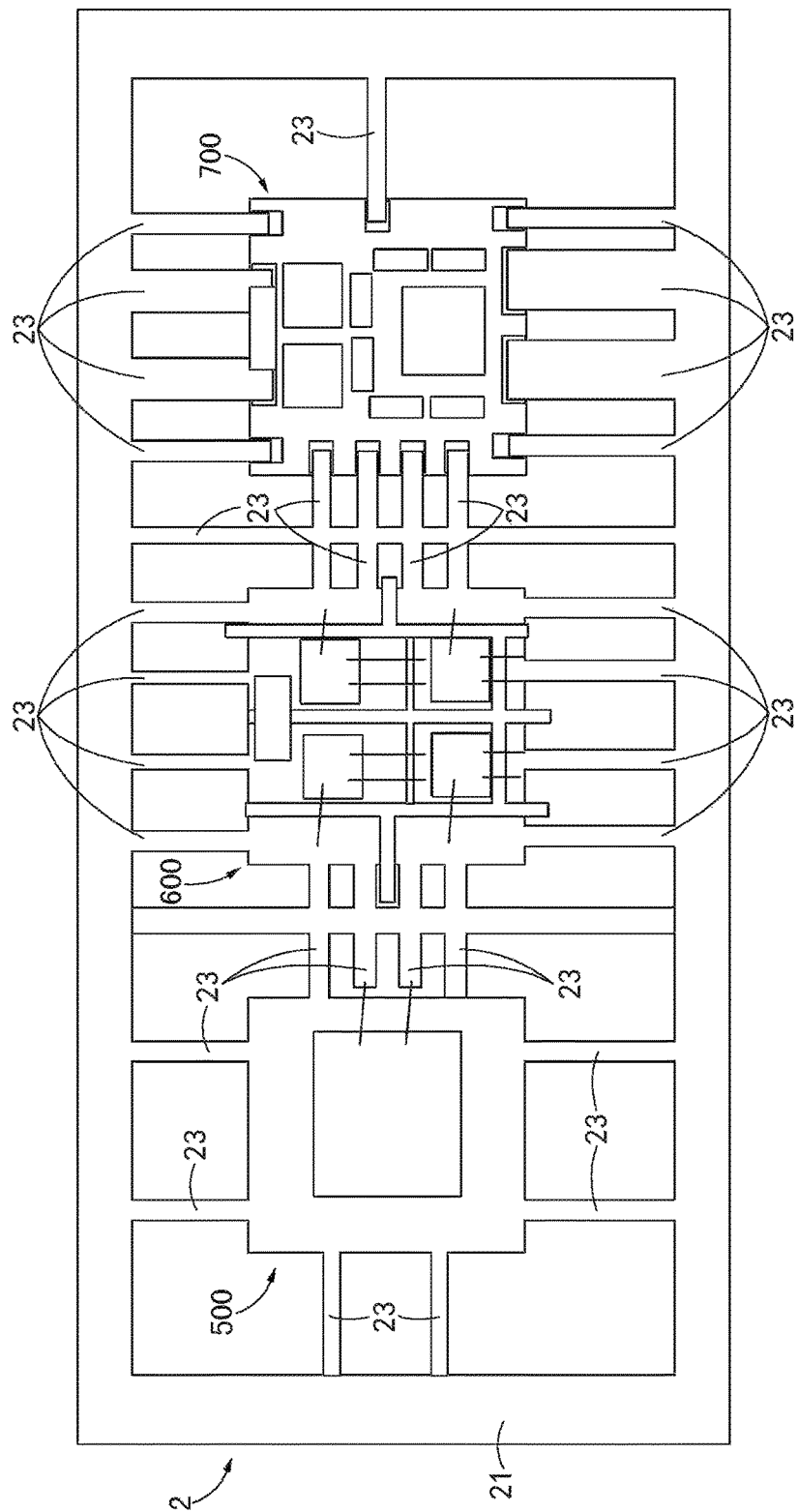

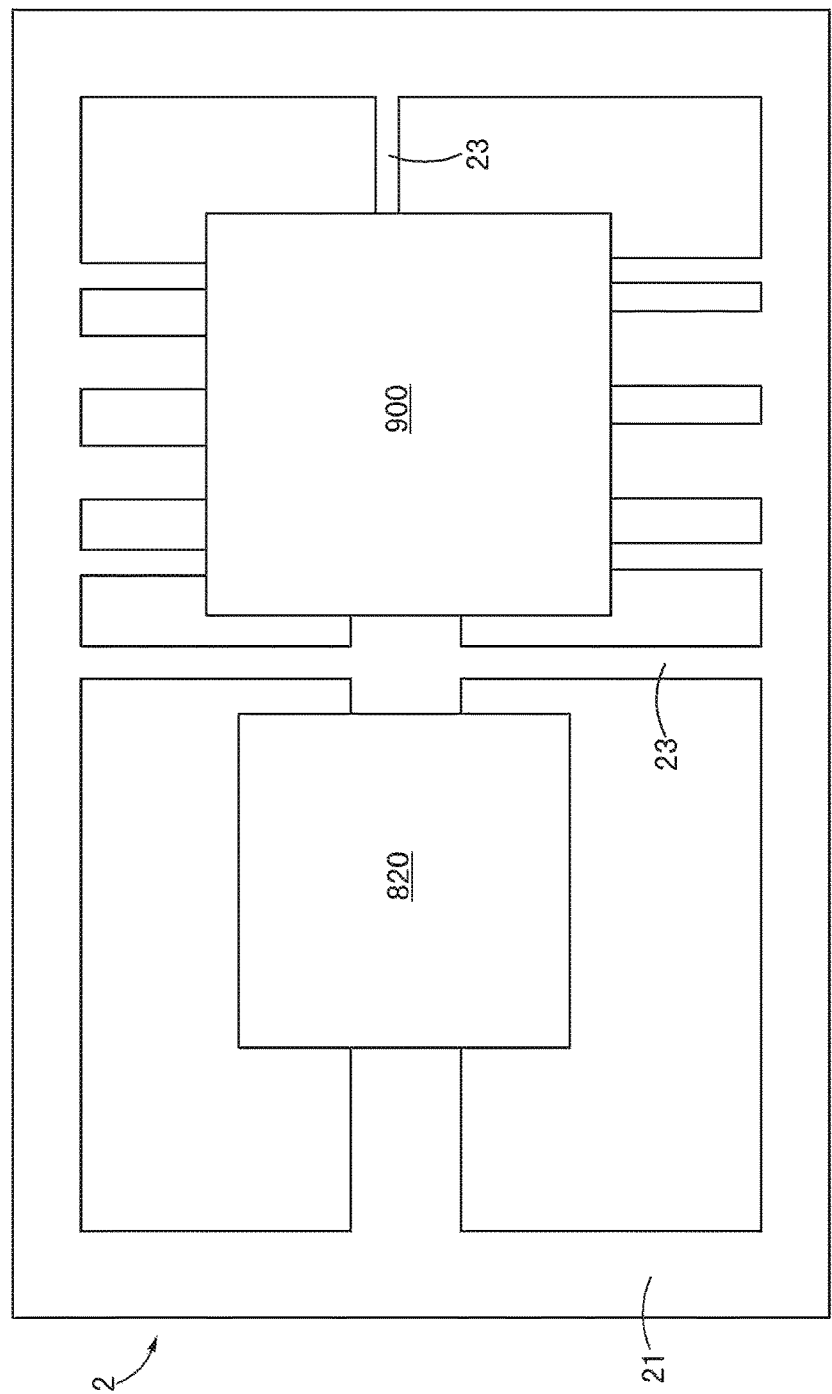

US 10,342,153 B2

1

STACK STRUCTURE AND THE MANUFACTURING METHOD OF THE SAME

CROSS REFERENCE

This application is based upon and claims priority to Chinese Patent Application No. 201510673944.X, filed on Oct. 16, 2015, the entire contents thereof are incorporated herein by reference.

TECHNICAL FIELD

The present disclosure relates to a stack structure and its manufacturing method.

BACKGROUND

In the related art, it is always required for performance of a power converter to be high efficiency, high power density and high reliability. Being high efficiency means having low energy consumption, which is helpful for energy conservation and emission reduction, environmental protection, and reducing of the usage cost. Being high power density then means small volume, light weight, which is capable of reducing cost for materials and transportation, and reducing the requirement on space. Being high reliability means longer service life and lower maintenance cost.

Semiconductors are one of the important factors determining the efficiency of the power converter. In the power converter, some assistant devices, such as fixtures, screws for fixing the semiconductor devices, thermal pads for assisting heat dissipation and so on, are inevitably required. Since there are a large amount of the discrete semiconductor devices constructing the power converter, resulting in cumbersome in mounting these assistant devices. Moreover, for the purpose of standardization, generally, the space utilization ratio (ratio of the volume of the chips to the volume of the package) for these discrete semiconductor devices is extremely low. For example, for the typical TO-247 package, the space utilization ratio is generally below 40%.

In order to meet the requirement for further improving the performance of the power supplies, an integrated power module is gradually developed. The integrated power module is to integrate a plurality of power chips as well as other devices on one piece of substrate, thus achieving higher space utilization ratio. Meantime, in order to further improve the heat dissipation ability and reliability of the power module, currently, molding compound having high thermal conductivity is used to seal all the devices into a block body, and the heat may be dissipated by conducting the same to a heat sink of the integrated power module via the molding compound; at the same time, the molding compound may improve the mechanical strength of the overall integrated power module, and protect the power chips therein against the invasion of the outside humid and corrosive gas, thus the reliability of the integrated power module even the system may be improved.

FIG. 1 shows a structure of the typical integrated module in the prior art, the integrated module is a power module, and includes a power chip 11, a magnetic component 12 such as a transformer, an inductor, or the like, a controlling chip 13 and a passive component 14 such as a resistor, a capacitor, or the like, all of the components are welded on a PCB (printed circuit board) 17, and electrical connections are formed between the components. The integrated module is further connected to an external system board through pins 15. The pins 15 may include a plurality of pins having different functions, such as power pins, signal pins, and so on. In order to dissipate the heat from the integrated power module more effectively, a heat sink 1 may be further mounted on a top surface or a bottom surface of the integrated power module.

The integrated module as described above has higher integration level and power density, however in a power supply system, generally, a plurality of integrated modules are needed, and the plurality of integrated module will occupy large footprint on the system board. In order to further reduce the footprint of the plurality of integrated modules, two or more integrated modules may be stacked on each other, to form a stack structure.

With reference to FIG. 2, FIG. 2 shows a conventional stack structure, the stack structure includes two stacked integrated modules 10, and these two integrated modules 10 are adhered together by an adhesive layer 18 therebetween. The corresponding pins of the two integrated modules 10 are fixedly connected by welding or adhering.

The above conventional stack structure may effectively reduce the footprint, however it still suffers from one or more problems as follows: 1) the two integrated modules are stacked after each of the integrated modules is made separately, resulting a complex production procedure, low efficiency and high production cost; 2) the corresponding pins between the two integrated modules are connected by welding or crimping, resulting the process to be more difficult; and 3) the connection positions between the pins of the two integrated modules have low connection strength, thus the reliability for the electrical connection and the mechanical connection is poor, and failure of the power supply system is easily occurred.

The above information disclosed in the background technology section is only used to facilitate understanding the background of the present disclosure, and thus it may include information which does not construct the prior art well-known by the person skilled in the related art.

SUMMARY

The present disclosure is made by considering at least a part of the above problems, and an embodiment of the present disclosure provides a stack structure having reliable electrical performance.

The present disclosure is made by considering at least a part of the above problems, and an embodiment of the present disclosure provides a method for manufacturing a stack structure with simple process.

The additional aspects and advantages of the present disclosure will be partly set forth in the following description, and partly become apparent from the description, or learned from the practice of the present disclosure.

According to one aspect of the present disclosure, a stack structure includes:

at least two stacked modules, wherein at least one of the modules is a power module;

at least one metal connection component which is in integrated structure and comprises a first end, a second end and a connection portion, while the first end is electrically connected to one of the modules and the second end is electrically connected to the other module;

at least one molding compound packaging the at least one module and the end of the metal connection component electrically connected to the module, respectively.

According to another aspect of the present disclosure, a method for manufacturing the stack structure is disclosed, said stack structure includes at least two modules consisted of at least one first module and at least one second module with the first module being a power module, comprises the steps of:

providing a lead frame, wherein the lead frame has a metal frame, at least two metal plate portions and a plurality of connection ribs, the connection ribs each comprises a first end, a second end and a connection portion;

directly mounting electronic components for constructing the at least two modules on the metal plate portions, respectively, part of the electronic components are electrically connected to the lead frame, part of the first ends of the connection ribs are electrically connected to the metal plate portions of the first module, and the second ends are electrically connected to the metal plate portions of the second module to form a metal connection component, and part of the first ends of the connection ribs are electrically connected to the first module or the second module, and the second ends are connected to the metal frame;

packaging the electronic components of the first module, the first ends of the metal connection portions which are electrically connected to the first module and the first ends of the part of the connection ribs which are electrically connected to the first module are packaged therein, and a connection portion of the metal connection component as well as the second ends and the connection portions of the part of the connection ribs are exposed;

removing the metal frame of the lead frame and part or whole of the connection ribs, the remaining connection ribs forms pins; and bending the metal connection component so that the two modules connected by the metal connection components are stacked one upon the other, to form the stack structure.

BRIEF DESCRIPTION OF THE DRAWINGS

The above and other features and advantages of the present disclosure will become more apparent by describing the exemplified embodiment in detail with reference to the attached figures.

FIG. 5A to FIG. 5D are schematic views showing the respective steps in a third embodiment of the method for manufacturing the stack structure according to the present disclosure;

FIG. 6A to FIG. 6E are schematic views showing the respective steps in a fourth embodiment of the method for manufacturing the stack structure according to the present disclosure;

DETAILED DESCRIPTION

Figure 1:
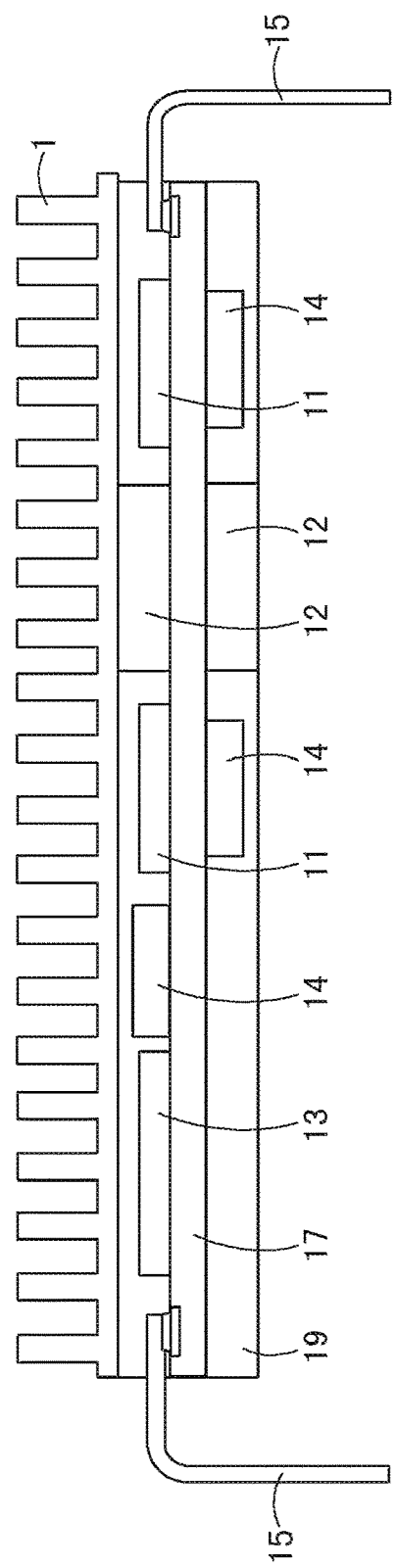
FIG. 1 is a schematic structure view showing an integrated power module in the prior art.
Figure 2:
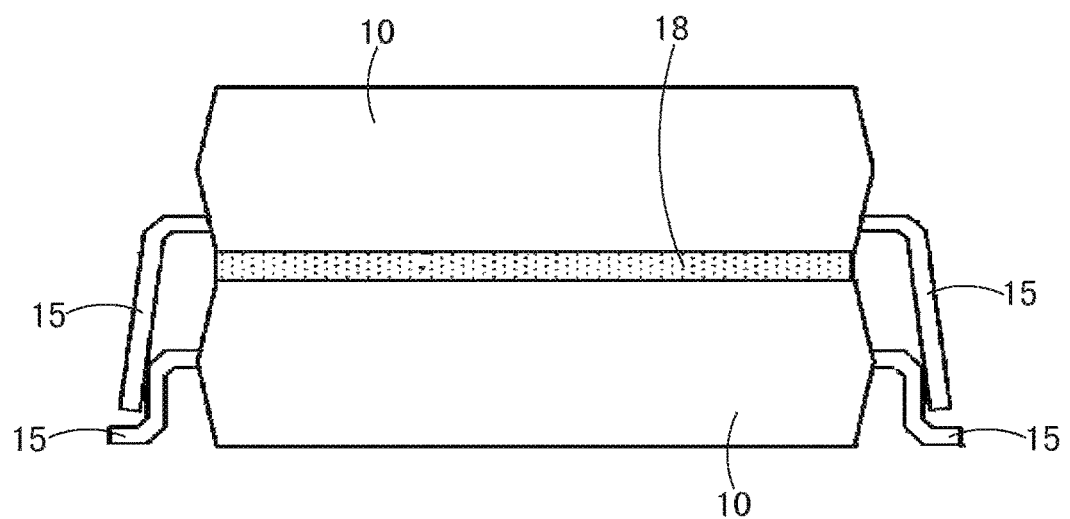
FIG. 2 is a schematic view showing a stack structure in the prior art.

Now, exemplary embodiments of the present disclosure will be more fully described with reference to the attached drawings. However, the exemplary embodiments may be implemented in various ways, and should not be construed as being limited to the embodiments set forth herein, rather, these embodiments are provided so that the present disclosure will be thorough and complete, and will fully convey the scope of the present disclosure to the person skilled in the related art. Throughout the drawings, the same reference numerals are used to refer to the same or similar structure, and thus its detail description will be omitted as necessary.

The sequence for describing the manufacturing method according to the present disclosure should not be construed as the sequence for implementing the present disclosure, and a different implementation sequence may also be applied to the present disclosure.

FIG. 3A to FIG. 3I are schematic views showing the respective steps in a first embodiment of the method for manufacturing a stack structure according to the present disclosure. The first embodiment of the method for manufacturing the stack structure according to the present disclosure is a method by which the stack structure is made by at least two modules consisted of at least one first module 100 and at least one second module 200, wherein one of the first module 100 and the second module 200 may be a power module or an integrated module integrating control and power functions. Generally, the method according to the present disclosure is performed by connecting the two modules by means of one lead frame, and thus the process procedures for welding the at least two modules when being stacked, etc. may be omitted, the assembly efficiency may be largely improved, and the production cost may be reduced.

Hereinafter, the method for manufacturing the stack structure according to the first embodiment of the present disclosure will be described in detail by way of example of a stack structure having two modules. Wherein the two modules are one first module 100 and one second module 200, respectively. The first module 100 for example includes a control chip 30. The second module 200 for example includes four power chips 40 and a capacitor 41. It will be appreciated that the electronic components respectively included in the first module 100 and the second module 200 according to the present disclosure should not be limited thereto, and the existing modules having other structure may also be applied in the present disclosure.

Figure 3A:
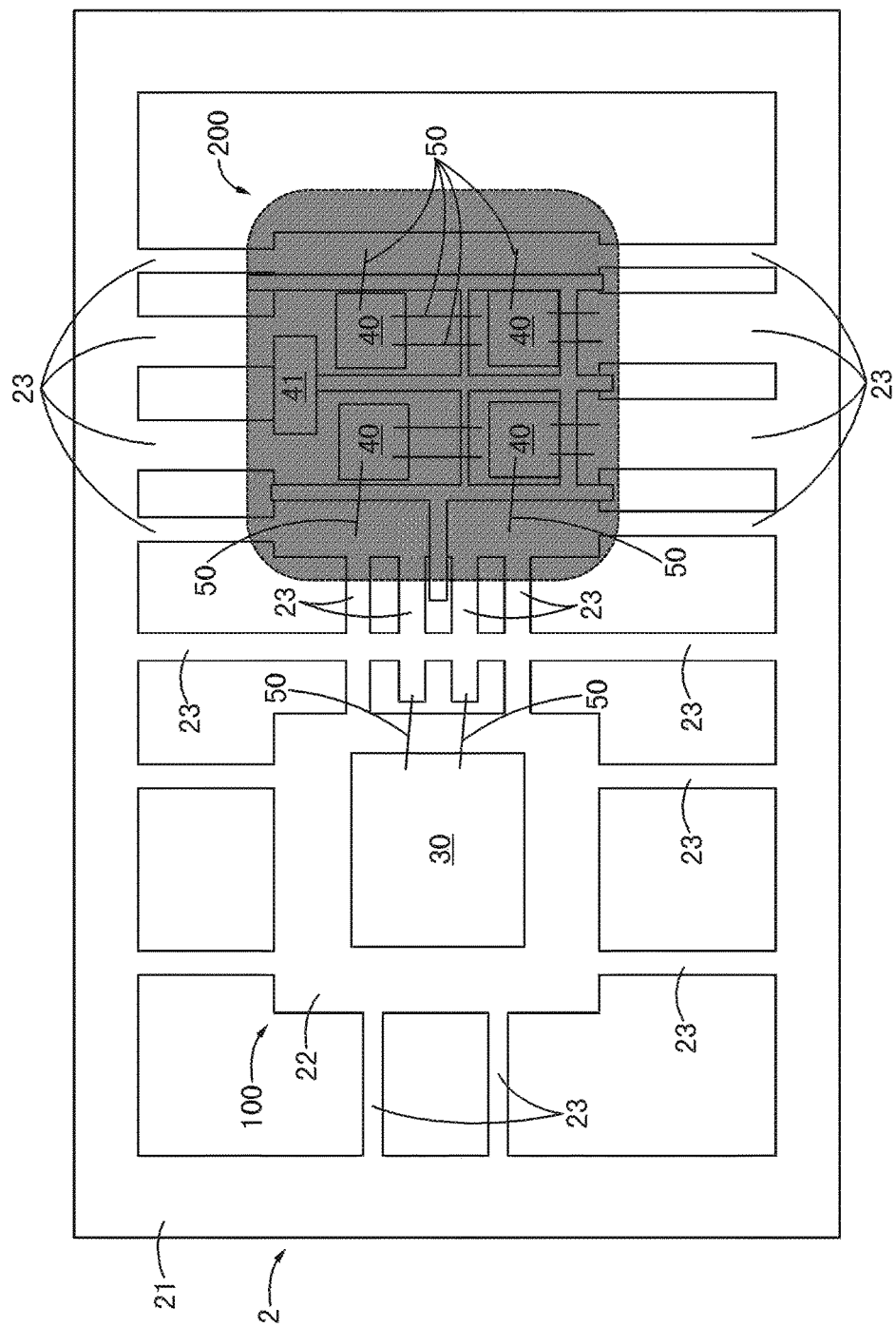
FIG. 3A to FIG. 3D are schematic views showing the respective steps in a first embodiment of a method for manufacturing a stack structure according to the present disclosure.

With reference to FIG. 3A to FIG. 3D, FIG. 3A to FIG. 3D are schematic views showing the respective steps in the first embodiment of the method for manufacturing the stack structure according to the present disclosure. The first embodiment of the method for manufacturing the stack structure according to the present disclosure includes the following steps:

With reference to FIG. 3A, a lead frame 2 is provided, the lead frame 2 may include a metal frame 21, a plurality of plate portions 22 and a plurality of connection ribs 23. The connection ribs 23 is connected between the metal frame 21 and the metal plate portions 22, between the respective metal plate potions, and between different portions of the metal frame 21. The connection ribs 23 each includes a first end, a second end and a connection portion. In the finally made stack structure, some of the connection ribs 23 may form metal connection components 230 for connecting the first module 100 and the second module 200 and pins 231 for the first module 100 and the second module 200. In the first embodiment, the first module 100 has no pins, and the second module 200 has the pins 231. In other embodiments, each of the plurality of modules may have the pins 231.

It is appreciated that the description for the lead form 2 is illustrative, and will not construct any limitation on the present disclosure. In the present disclosure, the lead frame in various structure may be used, for example, there may be more than two metal plate portions 22 in the lead frame, and the shape of the metal plate portion 22 is not limited to rectangle, the metal plate portion may be constructed by the connection ribs 23, or no metal plate portion 22 may be provided; and the arrangement of the connection ribs in the lead frame may be variously implemented.

With reference to FIG. 3A, next, the control chip 30 constructing the first module 100 is mounted on and electrically connected to one of the metal plate portions 22 of the lead frame 2, the four power chips 40 and the one capacitor 41 for constructing the second module 200 are respectively mounted on and electrically connected to another metal plate portion 22 of the lead frame 2. Some of the electronic components for constructing the first module 100 and the second module 200 may be mounted on the lead frame 2 by welding, lead bonding, adhesion, and so on.

There are a plurality of connection ribs 23 provided between the first module 100 and the second module 200, the first ends of some connection ribs 23 are electrically connected to the first module 100, and the second ends thereof are electrically connected to the second module 200, to form the metal connection components 230. For the other connection ribs 23, for example, the first ends thereof are electrically connected to the first module 100 or the second module 200 through the metal plate portions 22 of the lead frame 2, and the second ends thereof are connected to the metal frame 21 of the lead frame 2, to partly form the pins 231 of the first module 100 or the second module 200.

Figure 3B:
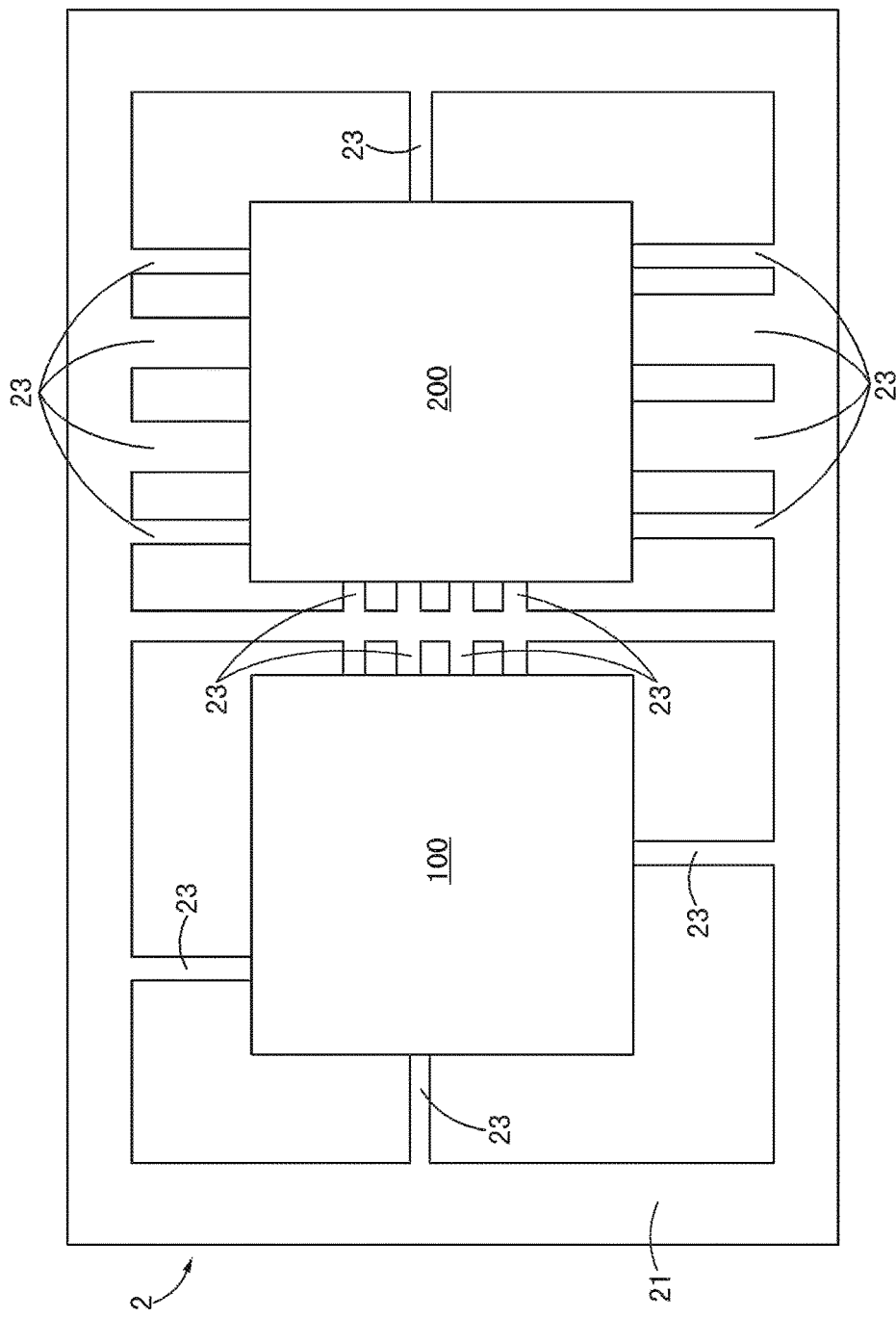
Figure 3C:
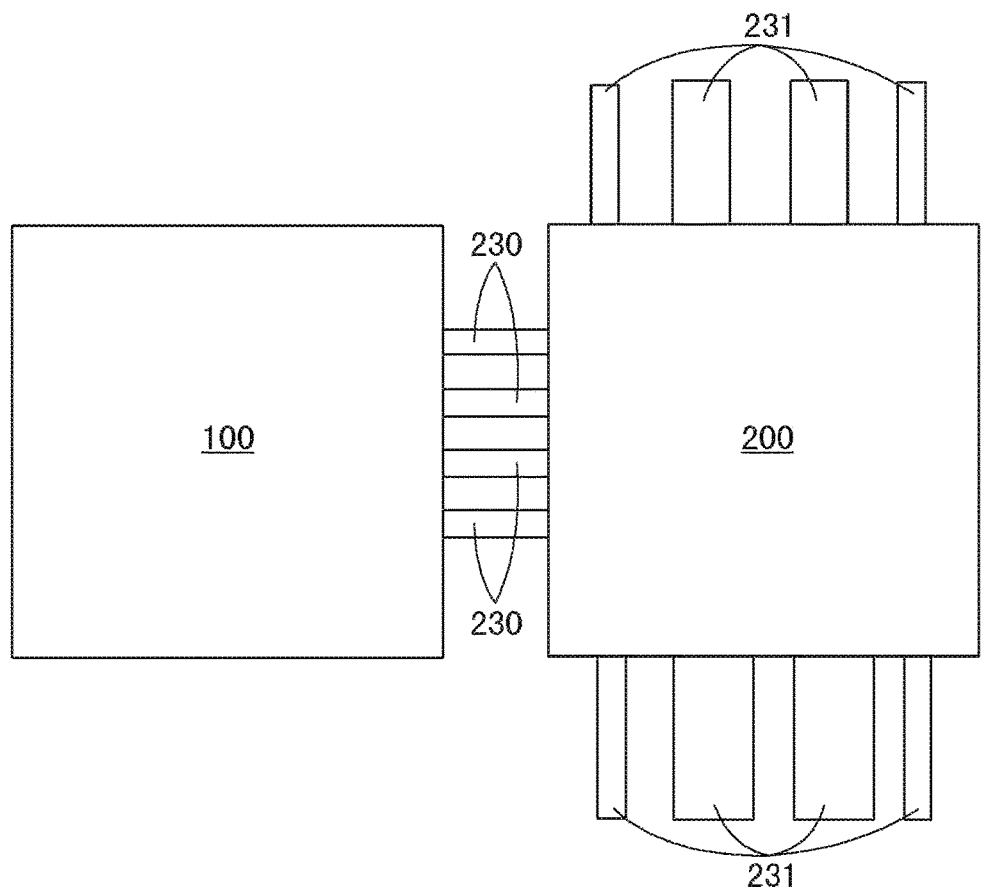

With reference to FIG. 3B and FIG. 3C, the electronic components of the first module 100 are packaged, specifically, the metal plate portions 22 and the control chip 30 mounted thereon are packaged by using molding compound, such as plastic material, and at the same time, first ends of the pins 231 in the first module 100 electrically connected to the metal plate portions 22 and first ends of the metal connection components 230 electrically connected to the metal plate portions 22 are also packaged, and the connection portions of the metal connection components 230, the connection portions and the second ends of the pins 231 are exposed. Since the electrical connection points between the metal connection components 230 and the modules are protected by the molding compound, and no welding point is exposed outside of the modules, thus the reliability of the system is largely improved.

With reference to FIG. 3B and FIG. 3C, the electronic components of the second module 200 are packaged, specifically, the metal plate portions 22 and the four power chips 40 and one capacitor 41 mounted thereon are packaged by using molding compound, such as plastic material, meantime, the first ends of the pins 231 in the second module 200 electrically connected to the metal plate portions and the second ends of the metal connection components 230 electrically connected to the metal plate portions 22 are packaged therein, and the connection portions of the metal connection components 230, the connection portions and the second ends of the pins 231 are exposed.

With reference to FIG. 3C, the metal frame 21 and part of the connection ribs 23 in the lead frame 2 located outside of the molding compound are removed.

Figure 3D:
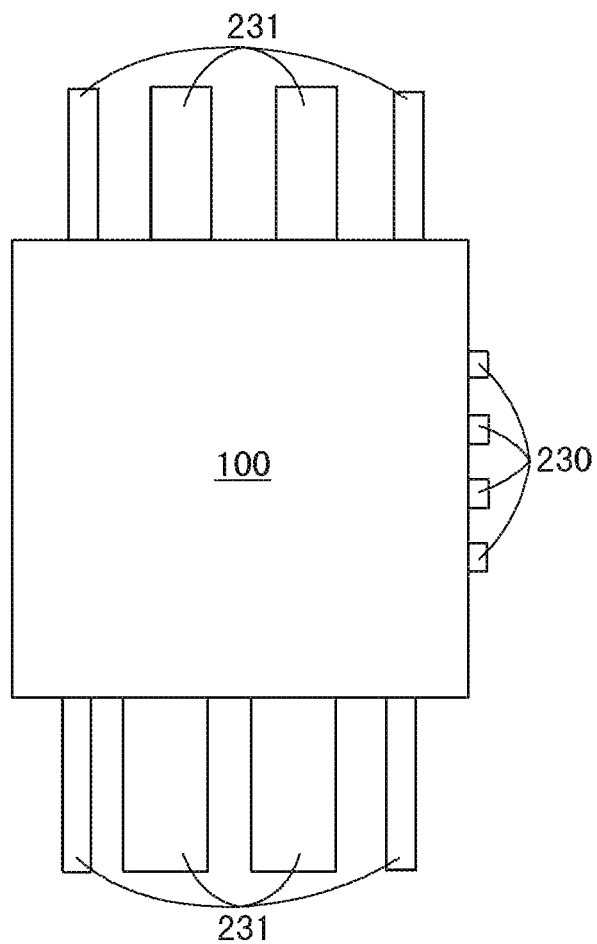

With reference to FIG. 3D, the metal connection components 230 are bend to stack the two modules connected by the metal connection components 230 on the top of each other, for example, the first module 100 is stacked on the second module 200, of course, the second module 200 may also be stacked on the first module 100.

In the above described method for manufacturing the stack structure, the sequence of procedure for packaging the first module 100 and the procedure for packaging the second module 200 may be exchanged, that is, the first module 100 is packaged firstly, and then the second module 200 is packaged, alternatively, the second module 200 may be packaged firstly, and then the first module 100 is packaged. Alternatively, the first module 100 and the second module 200 may be package simultaneously.

In the above described method for manufacturing the stack structure, alternatively, it is also practical that only one of the modules, e.g. the first module 100 is packaged, and the other module, e.g. the second module 200 is not packaged.

With reference to FIG. 3A and FIG. 3B, in the above described method for manufacturing the stack structure, alternatively, prior to packaging the first module 100, the method further includes a step of performing electrical connection by using a plurality of leads 50 (the leads may be in forms of bonding wire or Cu clip, etc). For example, by using the leads 50, the two power chips 40 are connected, the power chips 40 are connected to the pins 231, and the control chip 30 is connected to the pins 231. During the procedure of packaging the first module 100 or packaging the second module 200, the leads 50 are also packaged therein at the same time.

In the above described method for manufacturing the stack structure, alternatively, the method may further include the step of applying adhesive on outer surfaces of the first module 100 and the second module 200 which are opposite to each other upon being stacked, to fix the relative position between the first module 100 and the second module 200.

Figure 3E:
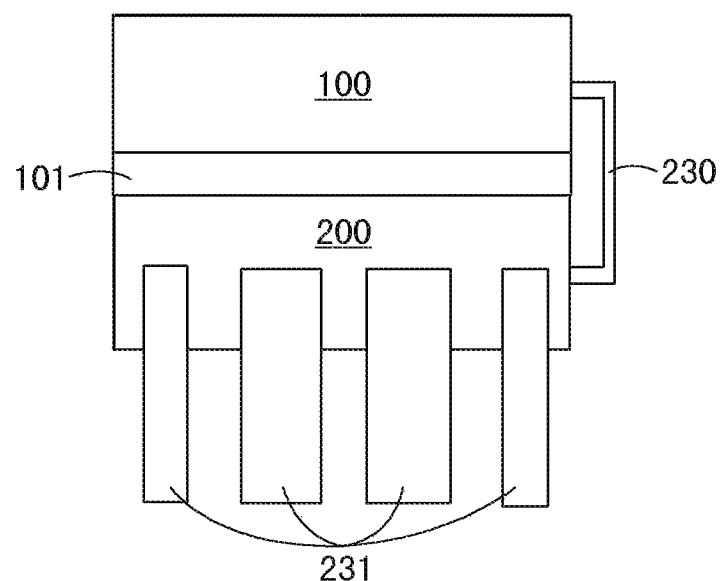
FIG. 3E is a schematic view showing bending pins in the first embodiment of the method for manufacturing the stack structure according to the present disclosure.
Figure 3F:
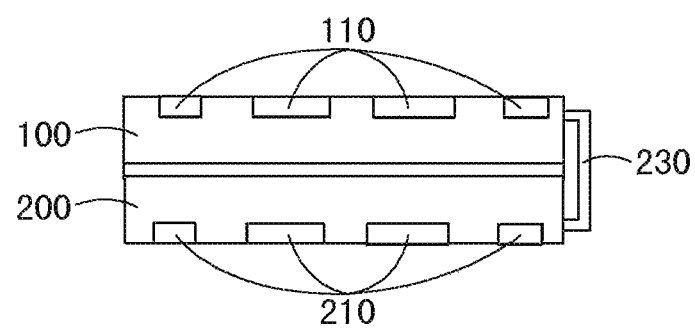
FIG. 3F is a schematic view showing a metal pad provided in the first embodiment of the method for manufacturing the stack structure according to the present disclosure.
Figure 3G:
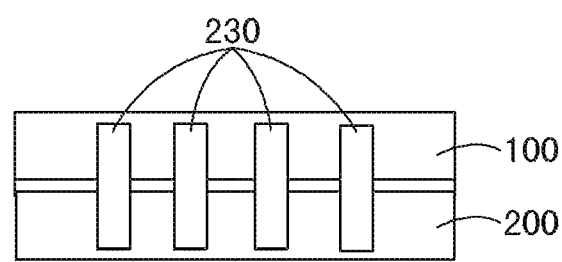
FIG. 3G is a right view of FIG. 3F.
Figure 3H:
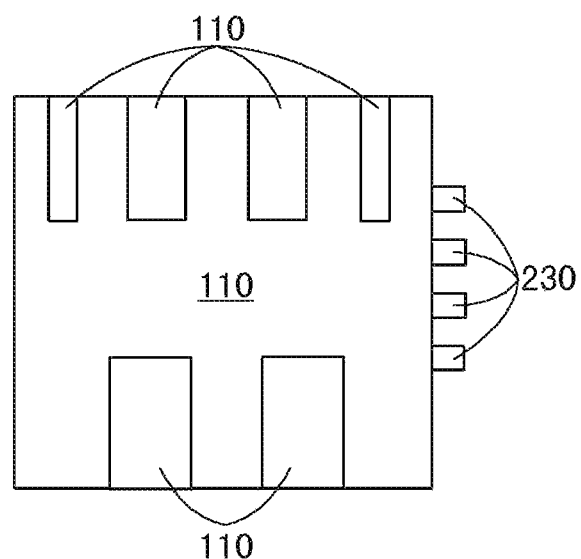
FIG. 3H is a top view of FIG. 3F.

With reference to FIG. 3E, in the above-described method for manufacturing the stack structure, alternatively, the method further includes the step of bending the pins 231, that is, the pins 231 are bend at any angle to facilitate to electrically connect with an external system.

With reference to FIG. 3F to FIG. 3I, in the above described method for manufacturing the stack structure, alternatively, the method further includes the steps of exposing metal pads 110, 210 on an outer surface of the first module 100 or an outer surface the second module 200 during the procedure for packaging the electronic components of the first module 100 or the second module 200; or removing part of the molding compound to expose the metal pad 110, 210 on the outer surface of the first module 100 or the outer surface of the second module 200 after the procedure for packaging the electronic components of the first module 100 or the second module 200 has been completed. The metal pads 110, 210 may be formed by exposing metal portions inside the module on the surface of the module.

Figure 3I:
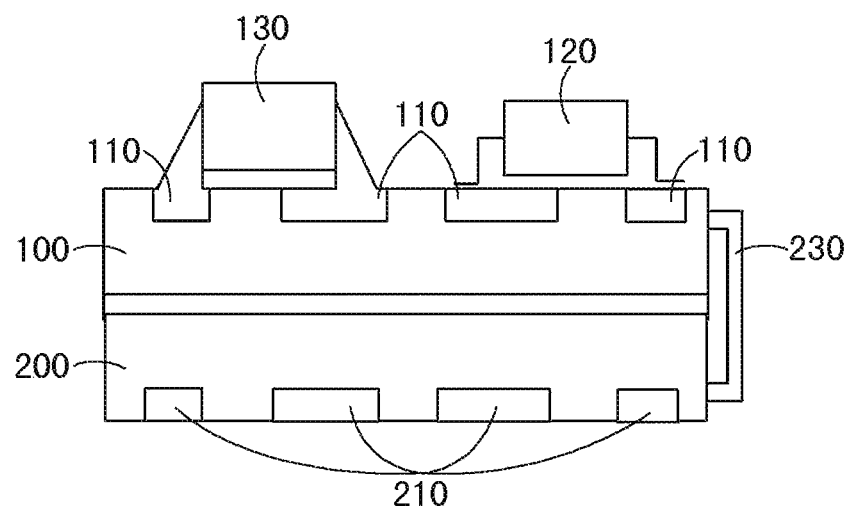
FIG. 3I is a schematic view showing an active device and a passive device provided on the metal pads as shown in FIG. 3F.

With reference to FIG. 3I, alternatively, active devices 120 such as a Metal Oxide Semiconductor Field Effect Transistor (MOSFET) or passive devices 130, such as a resistor, a capacitor, and so on may be mounted on the metal pads 110, 210 on the outer surface of the first module 100 or the outer surface of the second module 200 by Surface Mount Technology (SMT) and welded thereto, or the active devices 120 or the passive devices 130 may be welded on both the metal pads 110, 210 on the outer surfaces of the first module 100 and the second module 200. With these active devices 120 or passive devices 130, the circuit function may be further extended, the integration level of the stack structure may be improved, etc.

Figure 4:
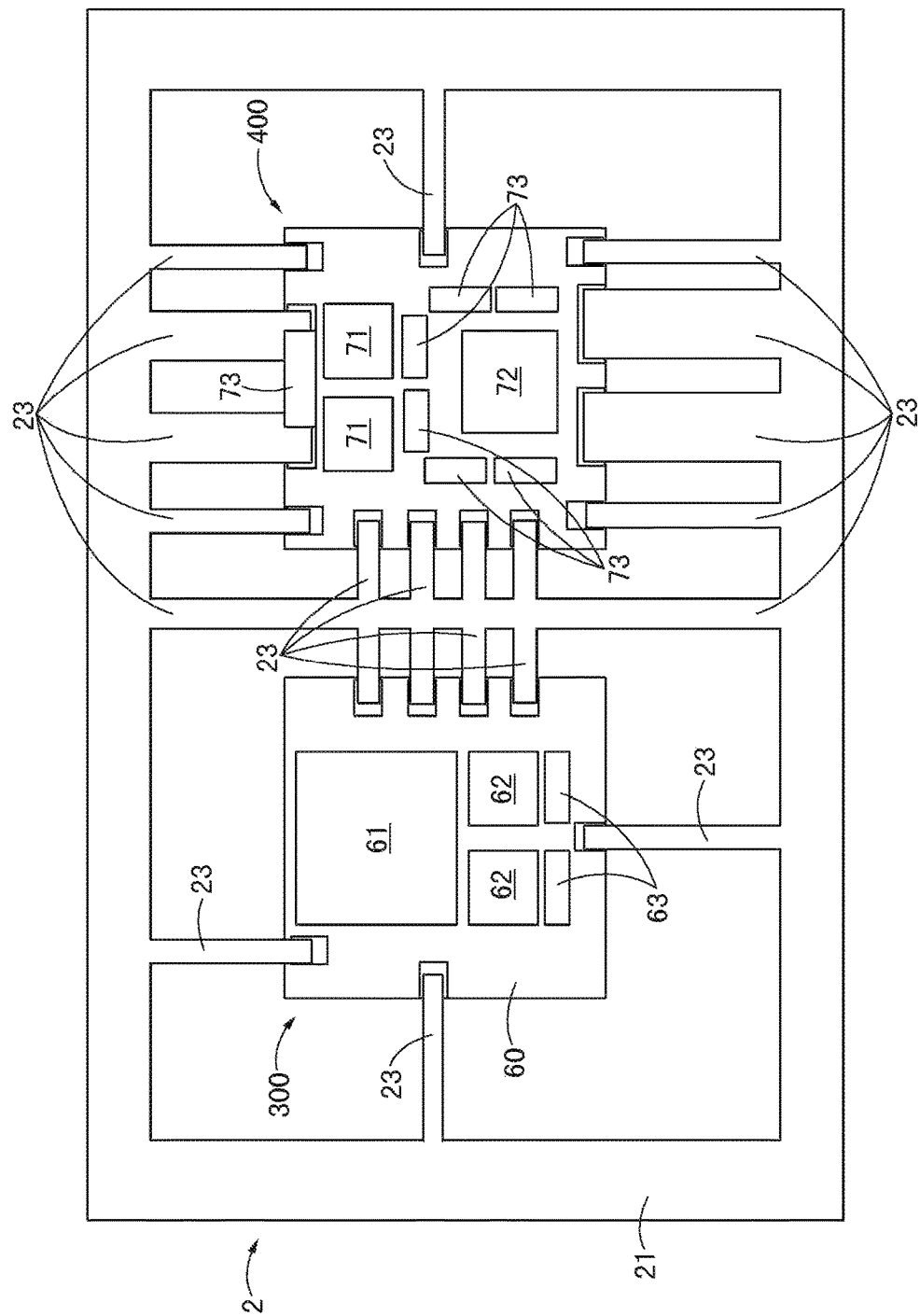
FIG. 4 is a schematic view showing a second embodiment of the method for manufacturing the stack structure according to the present disclosure.

With reference to FIG. 4, FIG. 4 is a schematic view showing the second embodiment of the method for manufacturing the stack structure according to the present disclosure. The second embodiment of the method for manufacturing the stack structure is different from the first embodiment mainly in that the lead frame 2 has different structure and the modules for constructing the stack structure have different specific structure, which will be described below in detail.

In the second embodiment, the stack structure includes two modules, i.e. a first module 300 and a second module 400.

The first module 300 includes a first substrate 60 and a magnetic component 61, such as a transformer, two power chips 62 and two capacitors 63 mounted on and electrically connected to the first substrate 60. Wherein the first substrate 60 may be a printed circuit board (PCB), a direct bonding copper (DBC) substrate, an insulated metal substrate (IMS) or another lead frame.

The second module 400 includes a second substrate 70, two power chips 71, one control chip 72 and seven capacitors 73 mounted on and electrically connected to the second substrate 70. Wherein the second substrate 70 may be a printed circuit board (PCB), a direct bonding copper (DBC) substrate, an insulated metal substrate (IMS) or another lead frame.

It is appreciated that the structure for the first module 300 and the second module as described herein is only illustrative, and does not construct any limitation on the scope of the present disclosure. Any one of the first module 300 and the second module 400 may have varied structure as necessary. The first module 300 and the second module 400 each may include or may not include the substrate.

The lead frame 2 includes a metal frame 21 and a plurality of connection ribs 23.

In the second embodiment of the method for manufacturing the stack structure, the first substrate 60 of the first module 300 and the second substrate 70 of the second module 400 are mounted on the lead frame 2, and the plurality of connection ribs 23 of the lead frame 2 are physically connected and electrically connected to the first module 300, the second module 400 and the lead frame 2, respectively.

In the second embodiment of the method for manufacturing the stack structure, the lead frame 2 may also have two metal plate portions 22, in this case, the first substrate 60 and the second substrate 70 may be mounted on these two metal plate portions 22, respectively.

The other procedures in the second embodiment of the method for manufacturing the stack structure are similar to that in the first embodiment, and therefore, will not be further described herein.

With reference to FIG. 5A to FIG. 5D, FIG. 5A to FIG. 5D are schematic views showing the respective steps in the third embodiment of the method for manufacturing the stack structure according to the present disclosure.

The third embodiment of the method for manufacturing the stack structure is different from the first embodiment mainly in that the lead frame has different structure and the number of the modules for constructing the stack structure is difference, which will be further described in detail below.

With reference to FIG. 5A, in the third embodiment, the stack structure includes three modules, that is, a first module 500, a second module 600 and a third module 700.

The first module 500 may be identical with the first module 100 in the first embodiment as shown in FIG. 3A.

The second module 600 may be identical with the second module 200 in the first embodiment as shown in FIG. 3A.

The third module 700 may be identical with the second module 400 in the second embodiment as shown in FIG. 4.

It should be understood that the structure of the above first module 500, the second module 600 and the third module 700 is only for illustration, and will not construct the limitation on the present disclosure. Any one of the first module 500, the second module 600 and the third module 700 may have structure varied as necessary.

Figure 5B:
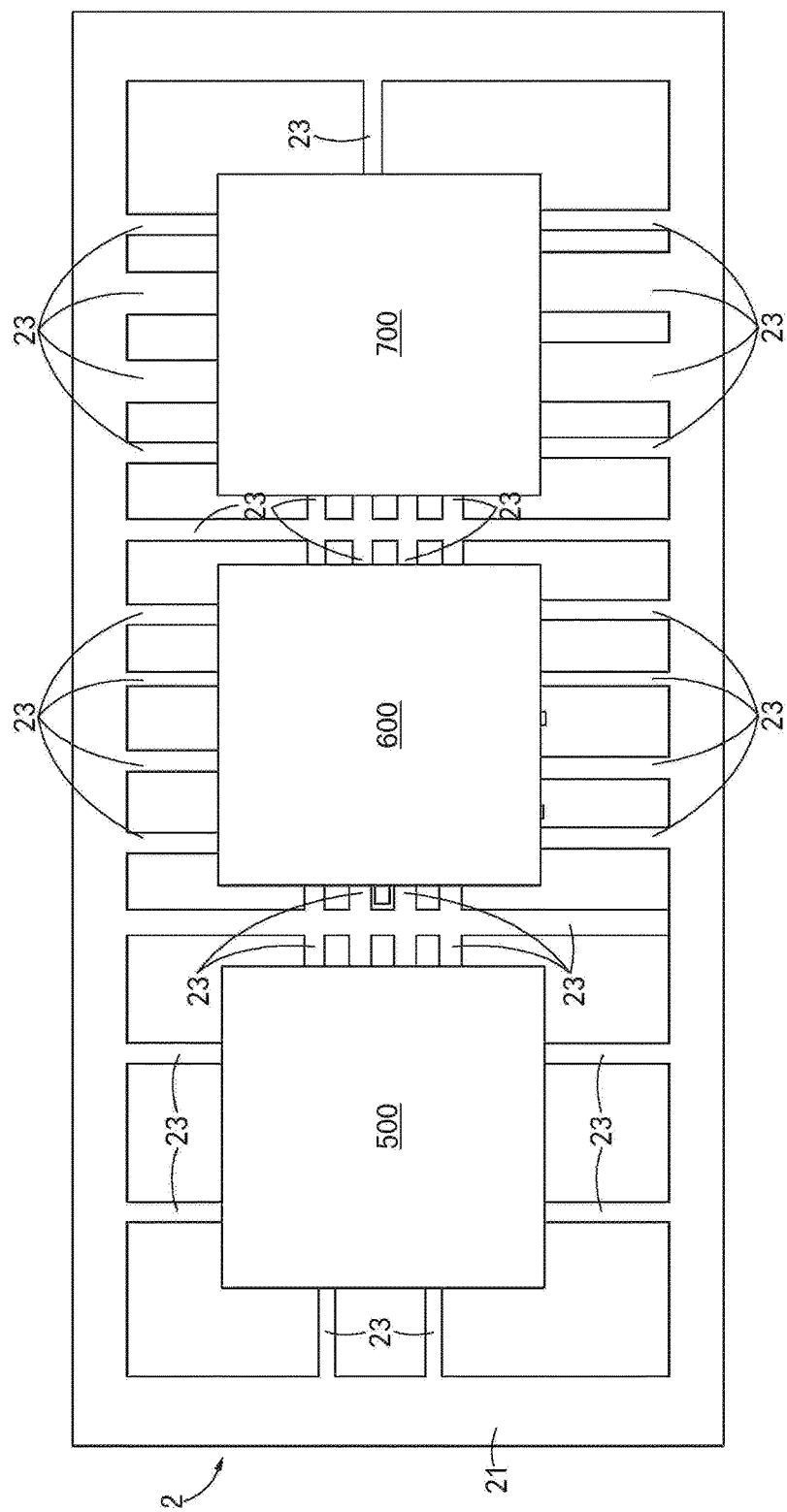

With reference to FIG. 5B, similar to the first embodiment of the method for manufacturing the stack structure, the first module 500, the second module 600 and the third module 700 are packaged.

Figure 5C:
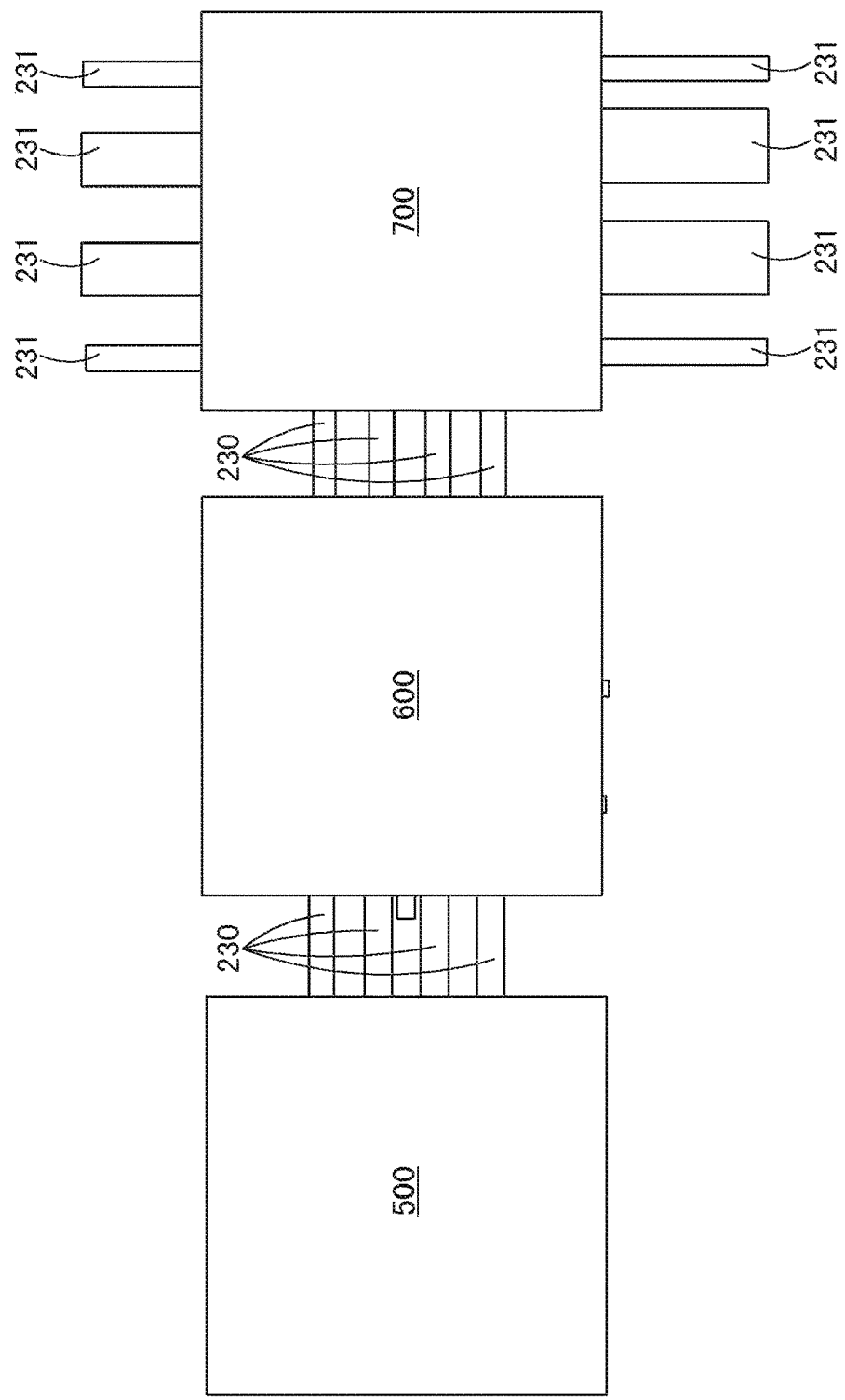

With reference to FIG. 5C, similar to the first embodiment of the method for manufacturing the stack structure, the metal frame and part of the connection ribs 23 of the lead frame 2 located outside the molding compound are removed.

In the third embodiment of the method for manufacturing the stack structure, there are two-part metal connection components 230, and the two part metal connection components 230 are respectively connected between the first module 500 and the second module 600 and between the second module 600 and the third module 700.

In the third embodiment of the method for manufacturing the stack structure, the first module 500, the second module 600 and the third module 700 may be arranged in a line on the lead frame, however the present disclosure is not limited thereto, and it is also feasible that the three modules may be arranged in other shape, e.g. in a right angle.

Figure 5D:
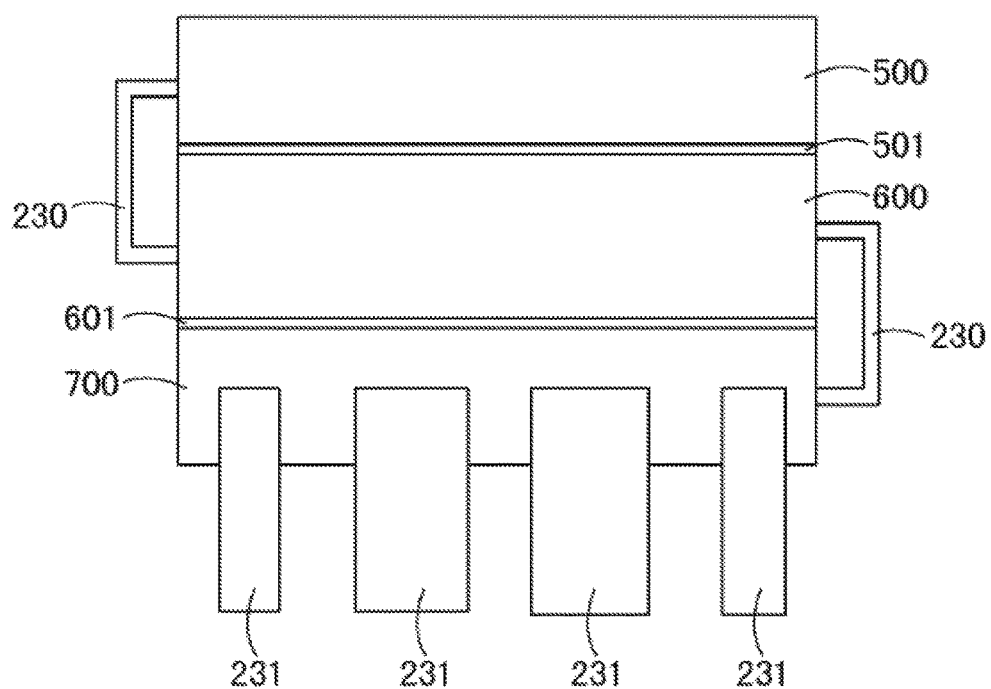

With reference to FIG. 5D, in the third embodiment of the method for manufacturing the stack structure, when the metal connection components are bent to form the stack structure, the two-part metal connection components are bent in opposite directions, e.g. upward and downward, respectively, so that the modules at the opposite sides may be stacked above and below the middle module, for example, the first module 500 is stacked above the second module 600, and the third module 700 is stacked below the second module 600. It is appreciated that the bending direction and the stacking sequence are not limited thereto.

Other procedures in the third embodiment for manufacturing the stack structure are identical with that in the first embodiment, and thus will not further described in detail herein.

In other embodiments, the number of the modules in the stack structure is not limited to three, and there may be more than three modules.

With reference to FIG. 6A to FIG. 6E, FIG. 6A to FIG. 6E are schematic views showing the fourth embodiment of the method for manufacturing the stack structure according to the present disclosure.

The fourth embodiment of the method for manufacturing the stack structure is different from the first embodiment mainly in that the specific structure of the modules for constructing the stack structure is different, which will be further described below in detail.

In the fourth embodiment, the stack structure includes two modules, that is, a first module 800 and a second module 900.

The first module 800, as an inductance module, may include an inductance core and an inductance winding.

The second module 900 may be identical with the second module 400 in the second embodiment as shown in FIG. 4.

It is appreciated that the first module 800 and the second module 900 may be varied as necessary.

Figure 6A:
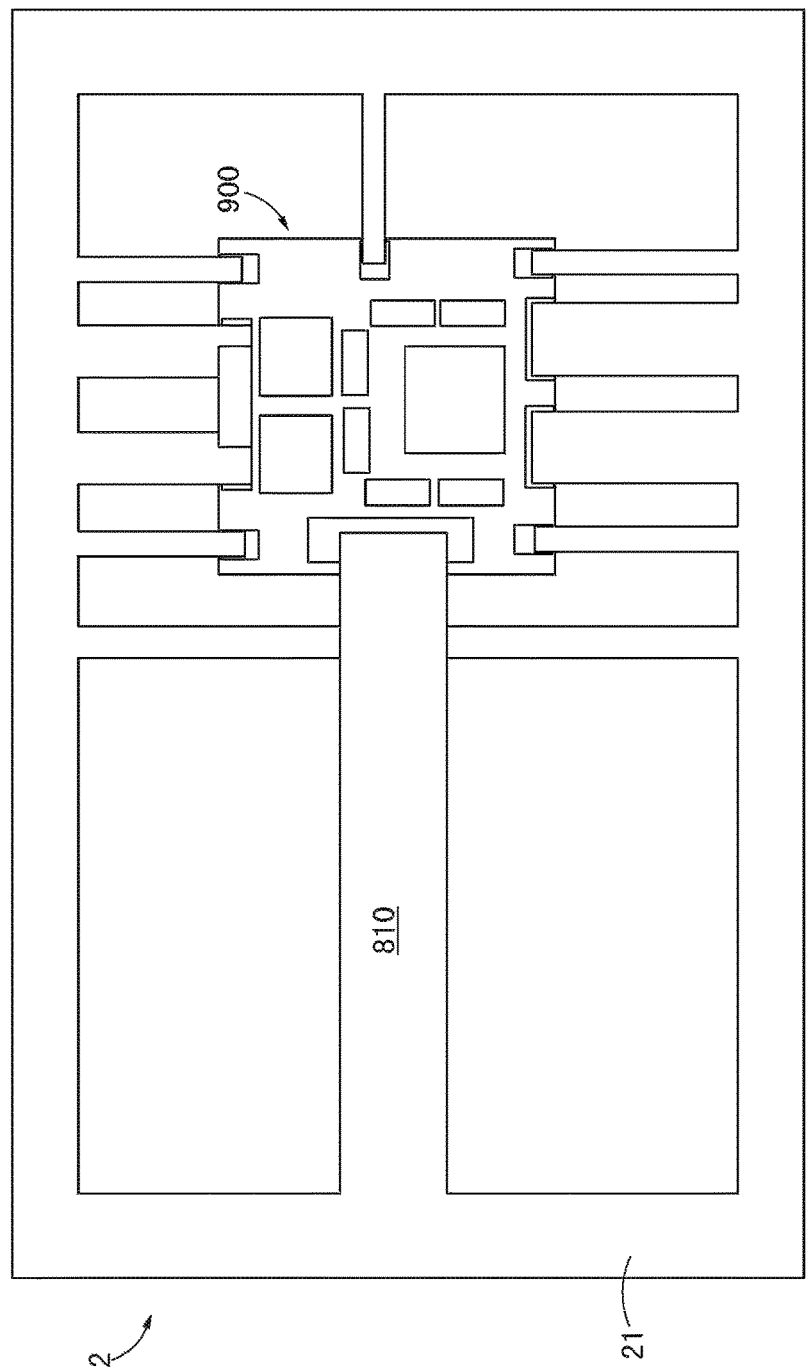

With reference to FIG. 6A, the lead frame 2 includes a connection rib 810 which may be used as the inductance winding.

Figure 6B:
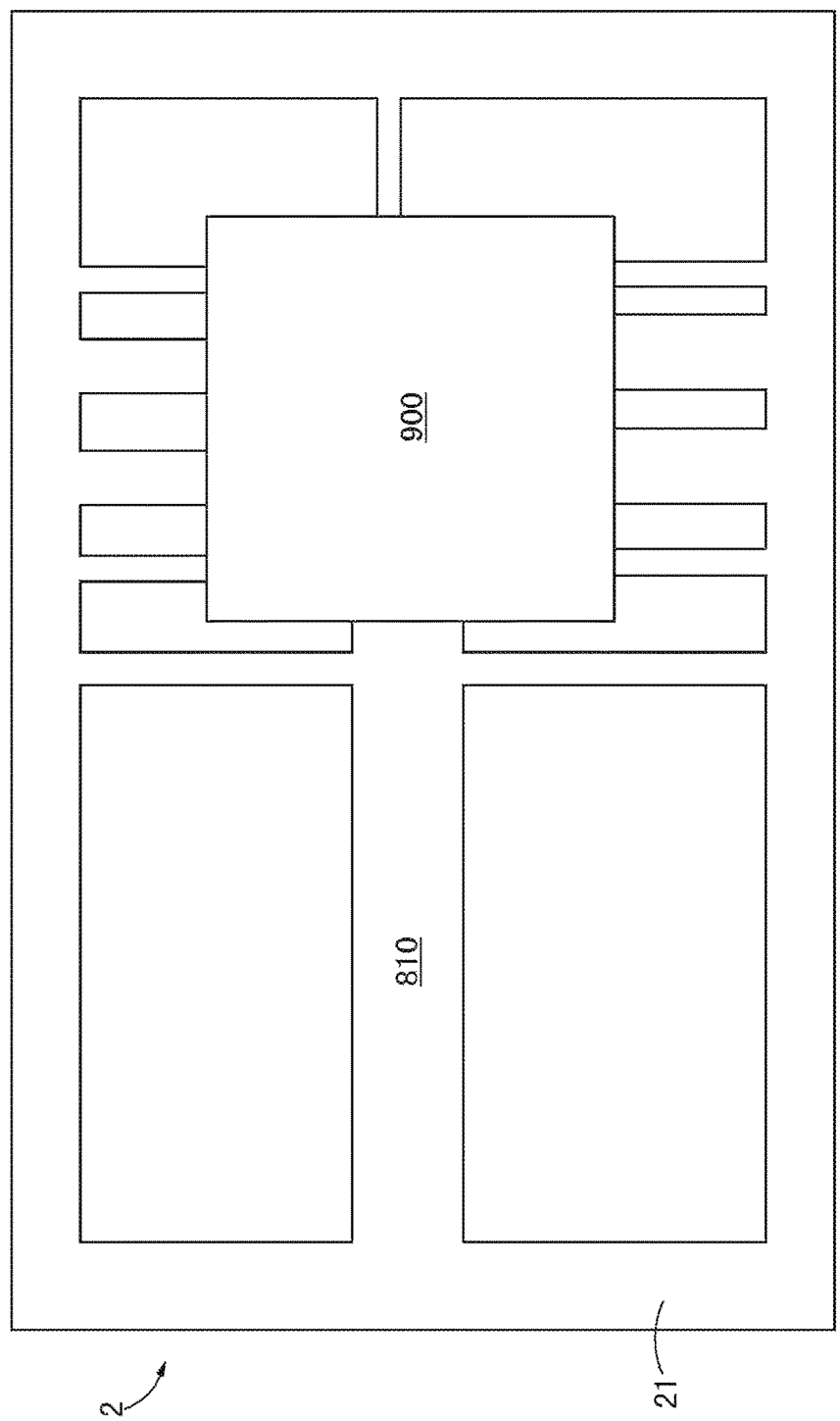

With reference to FIG. 6B, similar to the first embodiment of the method for manufacturing the stack structure, the second module 900 is packaged.

With reference to FIG. 6C, an inductance core 820 is assembled on the connection rib 810, so that the connection rib 810 is penetrated through a window of the inductance core 820, and thus the connection rib 810 and the inductance core 820 collectively construct the inductance module.

Figure 6D:
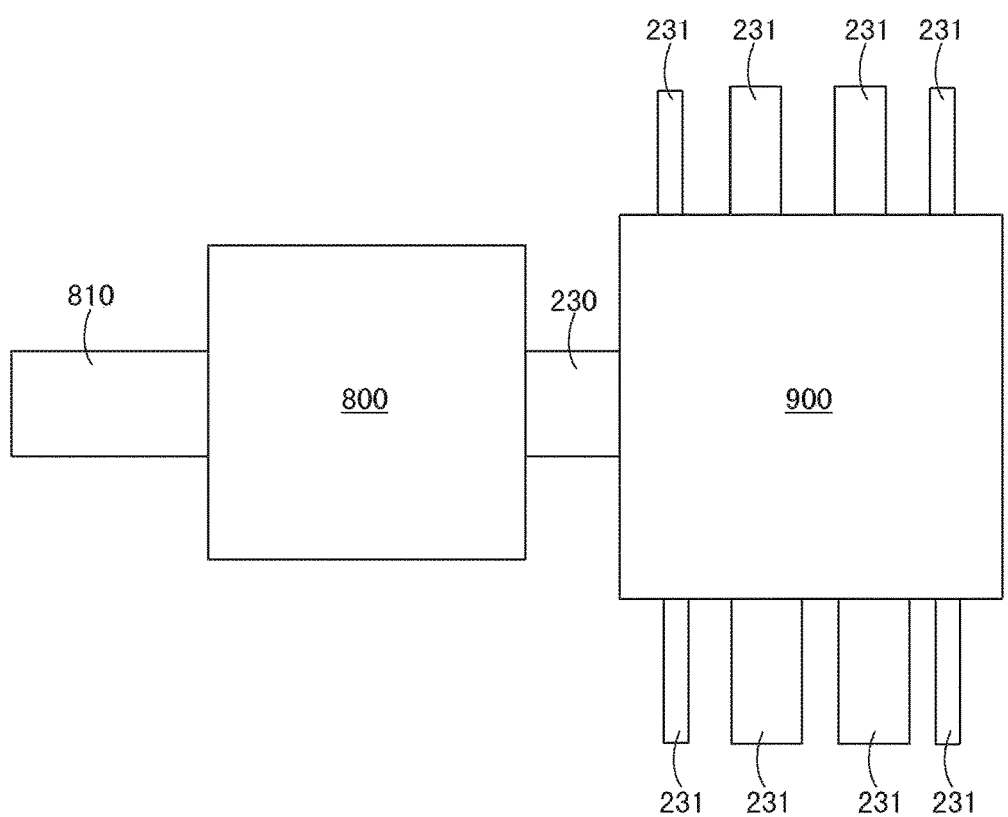

With reference to FIG. 6D, the metal frame 21 and part of the connection rib 23 of the lead frame 2 located outside of the first module 800 and the second module 900 are removed.

Figure 6E:
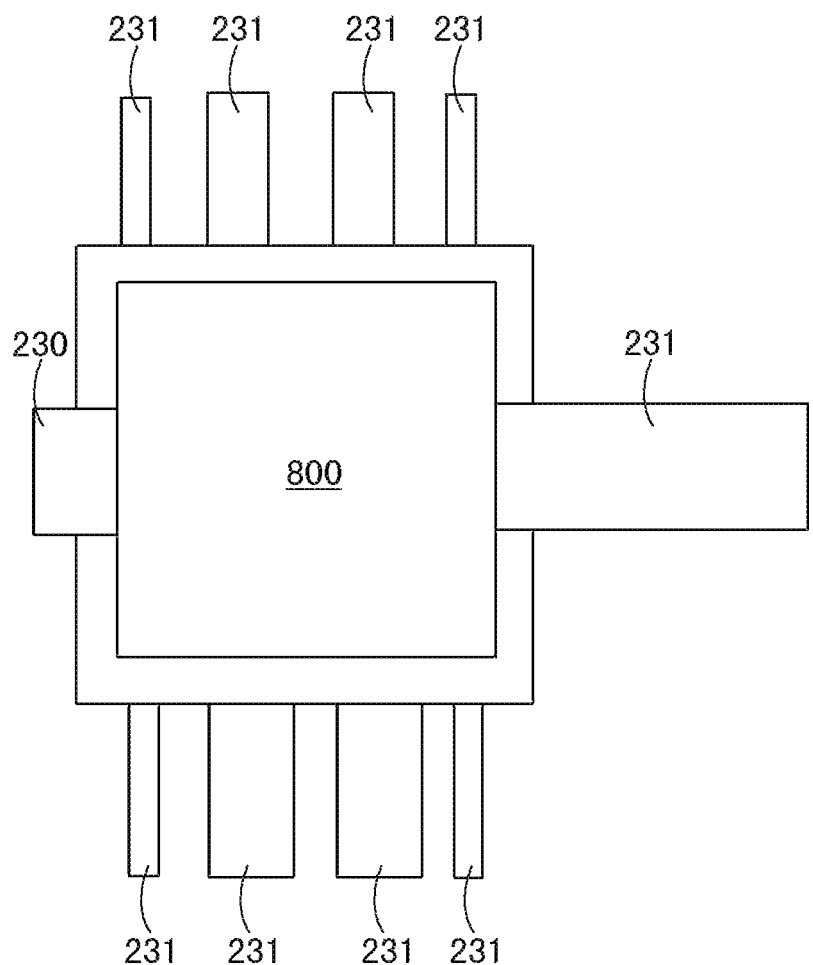
Figure 6F:
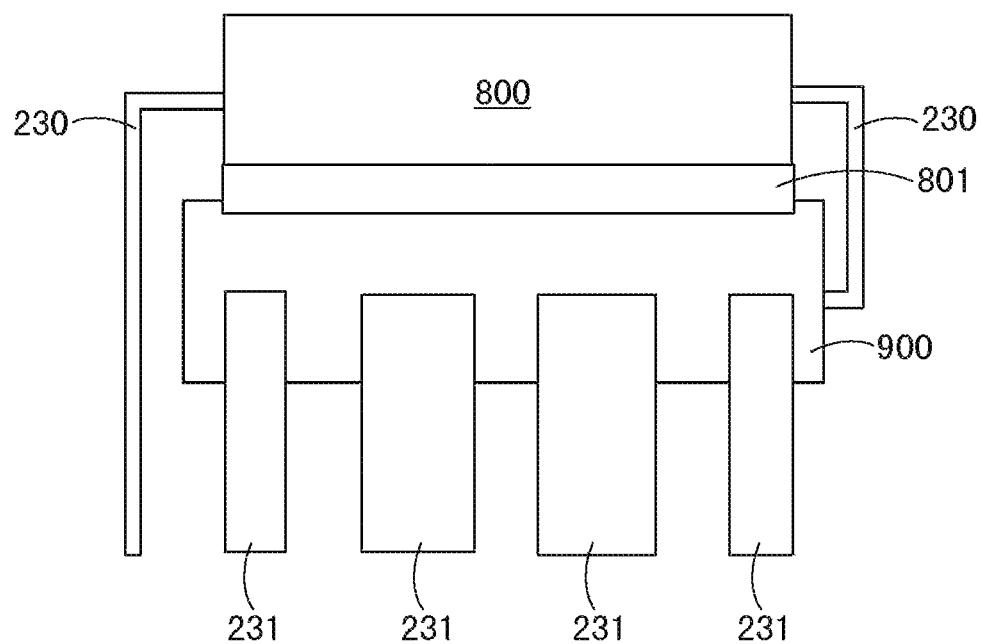
FIG. 6F is a schematic view showing the bending pins in the fourth embodiment of the method for manufacturing the stack structure according to the present disclosure, as shown in FIG. 6E.

With reference to FIG. 6E and FIG. 6F, the metal connection components 230 are bent to stack the two modules connected by the metal connection components 230 one upon the other, for example, the first module 800 is stacked on the second module 900, of course, the second module 900 may also be stacked on the first module 800. The connection rib 810 is bent to form the winding of the inductance module 800.

In this embodiment, a part of the lead frame is used as the winding of the inductor, at the same time, and in other embodiment, a part of the lead frame may also be used as a part of electrical function of other devices.

The other procedures in the fourth embodiment of the method for manufacturing the stack structure are identical with that in the first embodiment, and will not be further described herein.

The stack structure according to the present disclosure includes at least two modules, wherein at least one module is a power module. These modules are stacked, and the electrical connection between the modules is achieved by at least one metal connection component. Each of the metal connection components is an integrated structure, and has a first end, a second end and a connection portion, the first end of the metal connection component is electrically connected to one of the modules, and the second end is electrically connected to the other module, so as to achieve the electrical connection between the two modules. Since in the stack structure according to the present disclosure, the electrical connection between the corresponding electronic components of the two modules is achieved by an integrated metal component, it is possible to largely improve the assembly efficiency of the stack structure and reduce the cost. Hereinafter, the specific embodiment of the stack structure according to the present disclosure will be described in detail with reference to the attached drawings.

With reference to FIG. 3D and FIG. 3E, the first embodiment of the stack structure according to the present disclosure may be made by the first embodiment of the method for manufacturing the stack structure as shown in FIG. 3A to FIG. 3D.

The first embodiment of the stack structure according to the present disclosure includes a first module 100 and a second module 200, an adhesive layer 101 may be provided between the two modules and by this adhesive layer 101, the relative position between the two modules may be fixed. The electrical connection between the corresponding electronic components of the first module 100 and the second module 200 is achieved by at least one metal connection component 230 of the lead frame. Specifically, each of the metal connection components 230 is an integrated structure, and includes a first end, a second end and a connection portion, wherein the first end and the second end are respectively electrically connected to the first module 100 and the second module 200. In the stack structure according to the present disclosure, the two modules are connected by the metal connection components with integrated structure, other method for achieving the electrical connection between the two modules such as welding, adhesion, or the like is not necessary any more, thus, the stack structure according to the present disclosure has stable electrical connection, and the connection is robust.

In the first embodiment of the stack structure according to the present disclosure, the second module 200 has a plurality of pins 231 thereon, these pins 231 are also formed by the connection ribs of the same lead frame, that is to say, in the first embodiment of the stack structure according to the present disclosure, the metal connection components 230 and the pins 231 are formed by the same lead frame. In procedure, the electronic components for constructing the first module 100 and the second module 200 may be directly mounted on and electrically connecting to the same lead frame. In other embodiments, the first module 100 and the second module 200 both are provided with the pins 231 or are not provided with the pins 231.

It is appreciated that the electronic components included in each of the first module 100 and second module 200 are not limited thereto, and the existing modules with other structure may also be applied to the present disclosure. Alternatively, at least one module in the plurality of modules in the stack structure according to the embodiments of the present disclosure is a control module, alternatively, at least one module in the stack structure according to the embodiments of the present disclosure is integrated with power and control function, and may be the power module as above mentioned.

In the first embodiment of the stack structure according to the present disclosure, the electronic components of the second module 200 may be packaged by a molding compound, and the first ends of the pins 231 in the second module 200 electrically connected to the metal plate portions 22 and the second ends of the metal connection components 230 electrically connected to the metal plate portions 22 are also packaged therein, which, on one hand, reinforces steadiness of the mechanical connection, and on the other hand, protects the electrical connection points from water, moisture, and external force, thus further improves the reliability of the electrical connection between the modules. Likewise, the first module 100 may also be packaged by a molding compound.

In the above described stack structure, alternatively, inside the modules, the electrical connection between the electronic components and the pins 231, between the electronic components and the metal connection components 230, and between the electronic components may be achieved via leads, and these leads are packaged by the molding compound so as to be invulnerable.

With reference to FIG. 4, the second embodiment of the stack structure according to the present disclosure may be made by the second embodiment of the method for manufacturing the stack structure as shown in FIG. 6.

The second embodiment of the stack structure is different from the first embodiment mainly in that the structure of the modules constructing the stack structure is different. Specifically, the two modules in the second embodiment of the stack structure each includes a substrate, and the two modules are electrically connected to the same lead frame by its own substrate, respectively. That is to say, the electronic components in each of the modules are mounted on and partially electrically connected to the substrate, and the connection ribs of the lead frame for forming the metal connection components and the pins are electrically connected to the substrate, thus each of the modules is electrically connected to the metal connection components and the pins. Wherein the substrate may be a printed circuit board (PCB), a direct bonding copper (DBC) substrate, an insulated metal substrate (IMS), or may be another lead frame. It is appreciated that the two modules may both include or may not include the substrates.

Other structures of the second embodiment of the stack structure are identical with that of the first embodiment, and thus will not be further described herein.

With reference to FIG. 5D, the third embodiment of the stack structure according to the present disclosure is made by the third embodiment of the method for manufacturing the stack structure as shown in FIG. 5A to FIG. 5D.

The third embodiment of the stack structure is different from the first embodiment mainly in that the number of the modules for constructing the stack structure is different. Specifically, the third embodiment of the stack structure includes three stacked modules, i.e. a first module 500, a second module 600 and a third module 700. The first module 500 is adhesively fixed with the second module 600 by the first adhesive layer 501, and also a metal connection component 231 in integrated structure is connected between the first module 500 and the second module 600. The second module 600 is adhesively fixed with the third module 700, and also a metal connection component 231 in integrated structure is connected between the second module 600 and the third module 700. The third module 700 is electrically connected to the pins 230. The metal connection component 231 and the pins 230 may be formed by the same lead frame.

In other embodiments, the number of the modules in the stack structure is not limited to three, but may include more stacked modules.

The other structures in the third embodiment of the stack structure are identical with the first embodiment, and will not further described in detail herein.

With reference to FIG. 6E and FIG. 6F, the fourth embodiment of the stack structure according to the present disclosure may be made by the fourth embodiment of the method for manufacturing the stack structure as shown in FIG. 6A to FIG. 6E.

The fourth embodiment of the stack structure is different from the first embodiment mainly in that the modules have different structures. Specifically, the stack structure in the fourth embodiment includes two modules, i.e. a first module 800 and a second module 900, the two modules are fixedly connected by an adhesive layer 801, and are electrically connected by a metal connection component 230. The first module 800 is an inductance module, and the inductance module includes an inductance core 820 and an inductance winding, the inductance winding and the metal connection components 230 as well as the pins 231 are formed by the same lead frame.

The other structures in the fourth embodiment of the stack structure are identical with that in the first embodiment, and will not further described in detail herein.

With reference to FIG. 3I, the fifth embodiment of the stack structure according to the present disclosure may be made by the second embodiment of the method for manufacturing the stack structure as shown in FIG. 3F to FIG. 3I.

The fifth embodiment of the stack structure is different from the first embodiment mainly in that a plurality of metal pads 110 are provided on the upper surface of the first module 100, which are exposed outside of the molding compound for the module, and on the metal pads 110, active devices 120, such as a MOSFET and passive devices 130, such as a resistor, a capacitor, or the like may be surface mounted and welded. On the lower surface of the second module 200, a plurality of metal pads 210 are provided so as to be exposed outside of the molding compound of the module. Alternatively, on the plurality of metal pads 210, the active device and the passive device are also surface mounted and welded.

The other structures in the fifth embodiment of the stack structure are identical with that in the first embodiment, and will not further described in detail herein.

In one embodiment of the stack structure of the present disclosure, the two stacked modules are electrically connected by the metal connection component in integrated structure, the metal component in integrated structure has even structure and is not easily damaged, thus, the reliability of the electrical connection between the two stack modules may be improved.

In one embodiment of the method for manufacturing the stack structure of the present disclosure, the two modules are connected by the metal connection component of one lead frame, and the stack of the two modules may be easily achieved by bending the metal connection component, thus the process, such as welding, or the like between the two separate modules to be stacked together may be omitted, therefore the method is simple and practical, the assembling efficiency of the stack structure is largely improved, and the cost is reduced.

The exemplary embodiments of the present disclosure have been particularly shown and described above. It is appreciated that the present disclosure should not be limited to such disclosed embodiments, rather it is intended that the present disclosure covers various modifications and equivalent arrangements fallen within the sprit and scope of the appended claims.

What is claimed is:

1. A stack structure comprising:
   at least two stacked modules, wherein at least one of the modules is a power module;
   at least one metal connection component which is in integrated structure and comprises a first end, a second end and a connection portion, while the first end is electrically connected to one of the modules and the second end is electrically connected to the other module;
   at least two molding compounds respectively packaging at least two modules and the end of the metal connection component electrically connected to the module, the connection portion is exposed outside of the module, wherein the at least one metal connection component and the at least one pin are formed by a same lead frame.

2. The stack structure as claimed in claim 1, wherein the stack structure comprises:
   at least one pin which comprises a first end electrical connected to one of the modules, and the molding compound packages the first end of the pin which is electrically connected to the module therein.

3. The stack structure as claimed in claim 2, wherein the stack structure further comprises:
   a substrate, the electronic components of the at least one module are provided on the substrate, and the substrate is electrically connected to the metal connection component and part of the pins.

4. The stack structure as claimed in claim 3, wherein the substrate is a printed circuit board, a direct bonding copper substrate, an insulated metal substrate, or another lead frame.

5. The stack structure as claimed in claim 1, wherein the stack structure further comprises:
   at least one wire electrically connected part of electronic components inside the module with the frame lead.

6. The stack structure as claimed in claim 1, wherein the electronic components of the at least one module are directly provided on the lead frame.

7. The stack structure as claimed in claim 1, wherein at least one module in the at least two modules is a control module.

8. The stack structure as claimed in claim 1, wherein the power module in the at least two modules is integrated with control functions.

9. The stack structure as claimed in claim 1, wherein pads are provided on a surface of the at least one module.

10. The stack structure as claimed in claim 9, wherein active devices or passive devices are welded on the pad.

* * * * *